United States Patent

Song

[19]

[11] Patent Number: 6,153,014

[45] Date of Patent: Nov. 28, 2000

[54] METHOD OF CLEANING A SILICON WAFER USING A STANDARD CLEANING SOLUTION

[75] Inventor: Jong Kook Song, Suwon, Rep. of Korea

[73] Assignee: Samsung Electronics Co., Ltd., Suwon, Rep. of Korea

[21] Appl. No.: 09/115,686

[22] Filed: Jul. 15, 1998

[30] Foreign Application Priority Data

Aug. 26, 1997 [KR] Rep. of Korea ................. 97-40886

[51] Int. Cl.[7] .............................. B08B 3/04; B08B 3/08; B08B 3/10; C23G 1/02

[52] U.S. Cl. .................. 134/2; 134/3; 134/25.4; 134/26; 134/28; 134/29; 134/41; 134/902

[58] Field of Search ............................ 134/2, 3, 902, 134/25.4, 26, 41, 28, 29

[56] References Cited

U.S. PATENT DOCUMENTS

| | | | |
|---|---|---|---|
| 4,736,760 | 4/1988 | Coberly et al. | 134/134 |
| 5,176,756 | 1/1993 | Nakashima et al. | 134/2 |
| 5,229,334 | 7/1993 | Kato | 437/239 |
| 5,364,510 | 11/1994 | Carpio | 204/153.1 |
| 5,439,569 | 8/1995 | Carpio | 204/153.1 |
| 5,472,516 | 12/1995 | Hanson et al. | 134/18 |
| 5,520,837 | 5/1996 | Antin et al. | 252/135 |
| 5,578,273 | 11/1996 | Hanson et al. | 422/110 |
| 5,712,168 | 1/1998 | Schmidt et al. | 436/135 |
| 5,811,334 | 9/1998 | Buller et al. | 438/264 |
| 5,843,833 | 12/1998 | Ohtani et al. | 438/486 |
| 5,919,311 | 7/1999 | Shive et al. | 134/1 |
| 5,932,022 | 8/1999 | Linn et al. | 134/2 |

FOREIGN PATENT DOCUMENTS

| | | |
|---|---|---|
| 8-17775 | 1/1996 | Japan . |
| 92-15477 | 8/1992 | Rep. of Korea . |

OTHER PUBLICATIONS

Isao Takahashi et al., "Time–Dependent Variation of Composition of SC1 Solution" Jpn. J. Appl. Phys. vol. 32 (1993) pp. L1183–L1185, Part2, No. 9A, Sep. 1, 1993.

*Primary Examiner*—Zeinab El-Arini
*Attorney, Agent, or Firm*—Jones Volentine, LLC

[57] ABSTRACT

A wafer cleaning process using standard cleaning 1 (SC1) solution includes a step of supplementing the cleaning solution with predetermined amounts of $NH_4OH$ and $H_2O_2$, or $NH_4OH$, $H_2O_2$ and $H_2O$ during the cleaning of wafers with the solution so that a constant composition of the solution is maintained. After the cleaning solution is replaced with a fresh one, the solution is stabilized for a certain period of time to accomplish a complete mixing of the components therein. The present invention prolongs the useful life of standard cleaning solution and thus contributes to the efficiency of the cleaning process.

11 Claims, 8 Drawing Sheets

METHOD OF CLEANING A SILICON WAFER USING A STANDARD CLEANING SOLUTION

BACKGROUND OF THE INVENTION

1. Field of the Invention

The present invention relates generally to a method of cleaning a wafer with a cleaning solution, and which method allows the solution to be used for a long duration, thereby preventing waste and contributing to the efficiency of the cleaning process as a whole. More particularly, the present invention relates to a method of cleaning a wafer with a standard cleaning 1 solution, in which steps, such as adding $NH_4OH$ and $H_2O_2$, or $NH_4OH$, $H_2O_2$ and $H_2O$ to the solution, are carried out to maintain the composition of the solution, whereby the solution does not have to be replaced as often.

2. Description of the Related Art

Semiconductor integrated circuit devices are fabricated on and in a semiconductor wafer by processing the wafer through many processing stations. The wafer may be contaminated by impurities while it is transported between processing stations and/or during each process carried out at one of such stations. These impurities are generally removed from the wafer by a so-called wafer cleaning process. All of the semiconductor wafers are subjected to an RCA cleaning process in which the wafer is first cleansed with a high temperature organic solvent before being processed, and is again cleansed after each process of the fabrication method is carried out.

The RCA cleaning process for the silicon wafers involves the use of two kinds of cleaning solutions. First, the standard cleaning 1 (SC1) solution which comprises 1:1:5 to 1:2:7 of $NH_4OH:H_2O_2:H_2O$ is used. The SC1 solution oxidizes organic contaminants on the surface of the silicon wafer under the action of the $H_2O_2$ contained therein. Organic contaminants may be present because of the incomplete removal of a photoresist, and also because of airborne materials and the physical handling of the wafer. The $NH_4OH$ contained in the SC1 solution effectively removes heavy metal contaminants such as cadmium, cobalt, copper, iron, mercury, nickel or silver by forming amino complexes with them. When the amount of $NH_4OH$ in the SC1 becomes low, the surface roughness of the wafer will be decreased. Accordingly, the SC1 solution can reduce to having 1:2:10 or 1:4:20 by volume of $NH_4OH:H_2O_2:H_2O$.

Subsequently, the standard cleaning 2 (SC2) solution having a composition of 1:1:6 to 1:2:8 by volume of $HCl:H_2O_2:H_2O$ is used to remove alkaline metals such as aluminum or magnesium. The SC2 may be used alone or as mixed with a diluted HF solution.

Although the SC1 solution is effective in removing the contaminants on the silicon wafer surface, the time-dependent variation of the $NH_4OH:H_2O_2:H_2O$ composition is so great that it can only be used for a short time. See, e.g., Isao Takahashi et al. "Time-Dependent Variation of Composition of SC1 Solution", Jpn. J. Appl. Phys. Vol. 32 (September 1993), pp L1183–L1185.

FIG. 1, which is taken from the above-identified reference, is a graph showing the variation of $NH_4OH$ concentration depending on the time and temperature of the SC1 solution. In FIG. 1, the abscissa indicates time in minutes and the ordinate indicates the $NH_4OH$ concentration in molar concentration per unit volume (mol/l). The point ■ indicates the initial condition, the line—●—indicates the $NH_4OH$ concentration at 21° C., the line—■—at 50° C., and the line—▲—at 80° C. When the initial composition of the SC1 solution was $NH_4OH: H_2O_2 : H_2O=1:1:5$, the $NH_4OH$ concentration decreased with time, as shown in FIG. 1. The decrease in the rate was dependent on the temperature, i.e., the decrease in rate accelerated with increases in temperature. For example, for the temperature of 80° C., the $NH_4OH$ concentration decreased to 1/10 of its original value after 100 minutes.

The experiments performed by the present inventors to evaluate the time-dependent variation of the composition of the SC1 solution ($NH_4OH:H_2O_2:H_2O=1:4:20$) showed a decrease in rate of 0.07% by weight of $NH_3$/min and an increase in rate of 0.0037% by weight of $H_2O_2$ /min, as shown in FIG. 2. In FIG. 2, the abscissa indicates time in minutes, the left ordinate indicates $H_2O_2$ concentration in % by weight, and the right ordinate indicates $NH_3$ concentration in % by weight.

The decrease in the concentration of $NH_4OH$, which exists in the form of $NH_3$ molecules in the SC1 solution, results from the spontaneous evaporation of the $NH_3$. In particular, since the wafer cleaning process using the SC1 solution is carried out at an elevated temperature, the life of the solution is very short.

Generally, the wafer cleaning process is carried out as a batch process. One batch indicates a run of the process in which a certain number (e.g., 50) of wafers are placed in a cleaning bath containing the SC1 solution and the cleaning process is performed at a predetermined temperature. When the SC1 solution having $NH_4OH$ $H_2O_2:H_2O=1:4:20$ by volume is used, the solution should be replaced with a fresh one after 5 (five) batches are run or after about 100 minutes of use.

Such a frequent replacement of SC1 solution yields large volumes of waste solutions and is an obstacle in reducing the time necessary to complete the cleaning process.

SUMMARY OF THE INVENTION

Thus, an object of the present invention is to increase the life of the cleaning solution used in the wafer cleaning process and to improve the efficiency of the cleaning process.

Another object of the present invention is to improve the efficacy of the cleaning solution and to stabilize the cleaning system.

To achieve the former object, the present invention provides a method of cleaning a silicon wafer which comprises adding $NH_4OH$ and $H_2O_2$, or $NH_4OH$, $H_2O_2$ and $H_2O$ to a cleaning solution having an initial composition of $NH_4OH:H_2O_2:H_2O=x:1:5$ by volume, in amounts that maintain a constant concentration of $NH_4OH$, $H_2O_2$ and $H_2O$ in the solution.

More specifically, the $NH_4OH$ is added in an amount of 19–20% of its initial weight in solution every 10 minutes, the $H_2O_2$ is added in an amount of 0.5–2% of its initial weight every 10 minutes, and $H_2O$ is added in an amount of 0–1% of its initial weight every 10 minutes.

To achieve the latter object, after the cleaning solution is replaced with a fresh one, the solution is allowed to stand for, for example, 10–30 minutes.

BRIEF DESCRIPTION OF THE DRAWINGS

These and various other objects, features and advantages of the present invention will be described with reference to the accompanying drawings, in which.

DETAILED DESCRIPTION OF THE PREFERRED EMBODIMENTS

Figure 1:
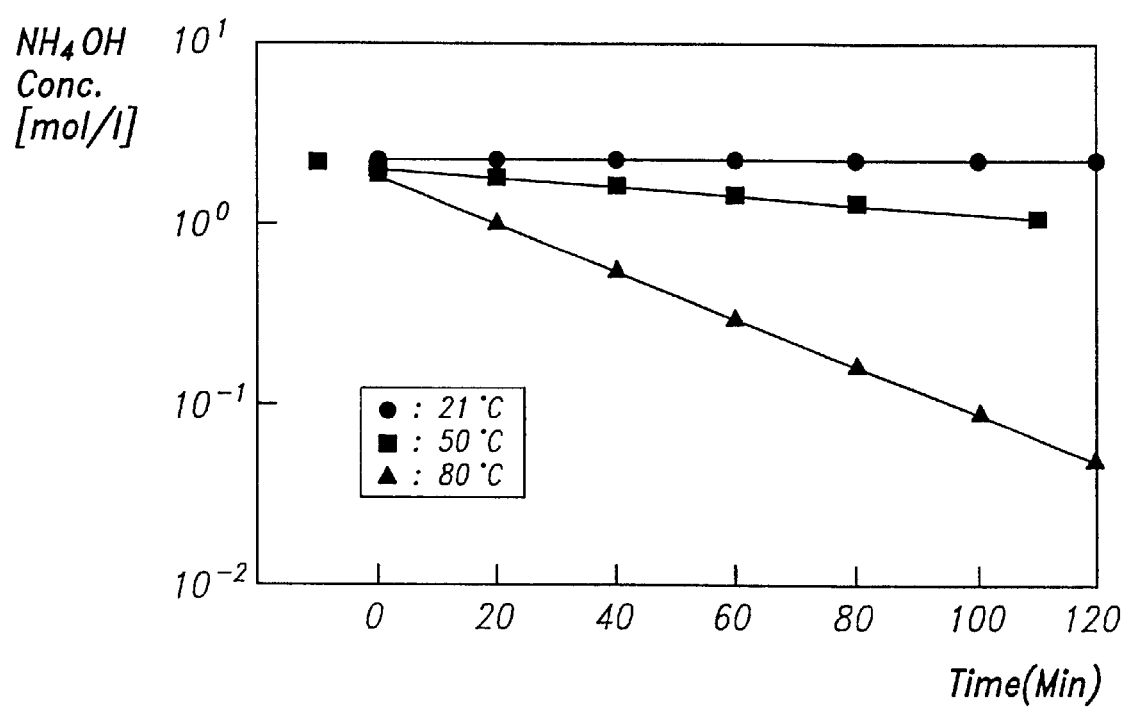
FIG. 1 is a graph showing the variation of the concentration of NH$_4$OH in a standard cleaning 1 solution, having an initial composition of NH$_4$OH:H$_2$O$_2$:H$_2$O=1:1:5 by volume, with temperature and time.
Figure 2:
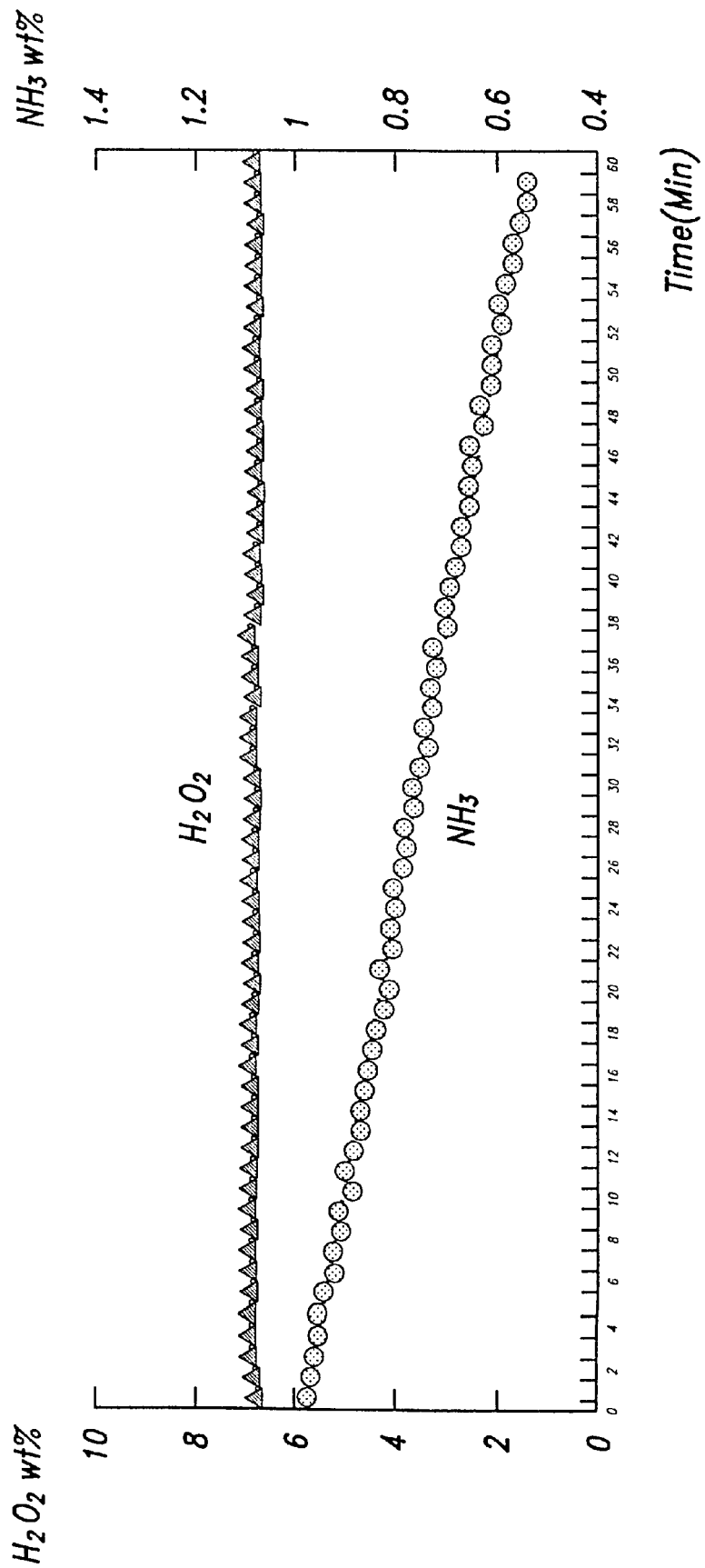
FIG. 2 is a graph showing the variation of the concentration of NH$_4$OH in a standard cleaning 1 solution, having an initial composition of NH$_4$OH:H$_2$O$_2$:H$_2$O=1:4:20 by volume, with temperature and time.

The cleaning process of the present invention will now be described in more detail with reference to FIG. 3. A cleaning solution (standard cleaning 1 solution; SC1 solution) having an initial composition of NH$_4$OH:H$_2$O$_2$:H$_2$O=x:1:5 by volume is introduced into a cleaning bath (10 in FIG. 3). When the SC1 solution is heated to a predetermined temperature, a certain number of wafers are placed into the bath and are cleaned. The cleaning of the wafers is carried out while adding predetermined amounts of NH$_4$OH and H$_2$O$_2$, or NH$_4$OH, H$_2$O$_2$ and H$_2$O to maintain a fixed composition thereof (12 in FIG. 3). After the cleaning process is completed, the wafers are removed (14 in FIG. 3).

After one batch is run, another batch of a certain number of wafers to be cleaned are placed into the bath and are cleaned while predetermined amounts of NH$_4$OH and H$_2$O$_2$, or NH$_4$OH, H$_2$O$_2$ and H$_2$O are again added to the bath. After a certain number of runs, for example thirty (30) runs, of the batch are completed (16 in FIG. 3), the cleaning solution is drained from the bath (18 in FIG. 3), and a fresh cleaning solution is introduced into the bath (20 in FIG. 3). The fresh cleaning solution is allowed to stand for a certain period of time, for example 10–30 minutes to stabilize the cleaning solution (22 in FIG. 3), and then new wafers to be cleaned are placed into the solution to begin the subsequent batch run (24 in FIG. 3). The stabilization of the fresh solution allows for all of the components thereof to become sufficiently mixed.

The wafers cleaned by the SC1 solution are then subjected to the second cleaning process using a second standard cleaning (SC2) solution having a composition of HCl, H$_2$O$_2$ and H$_2$O to remove alkaline metal contaminants (26 in FIG. 3) therefrom. The second cleaning process can be performed by the SC2 solution alone or as mixed with a diluted HF solution (e.g., 1000:1 or 200:1 dilution of HF).

Figure 3:
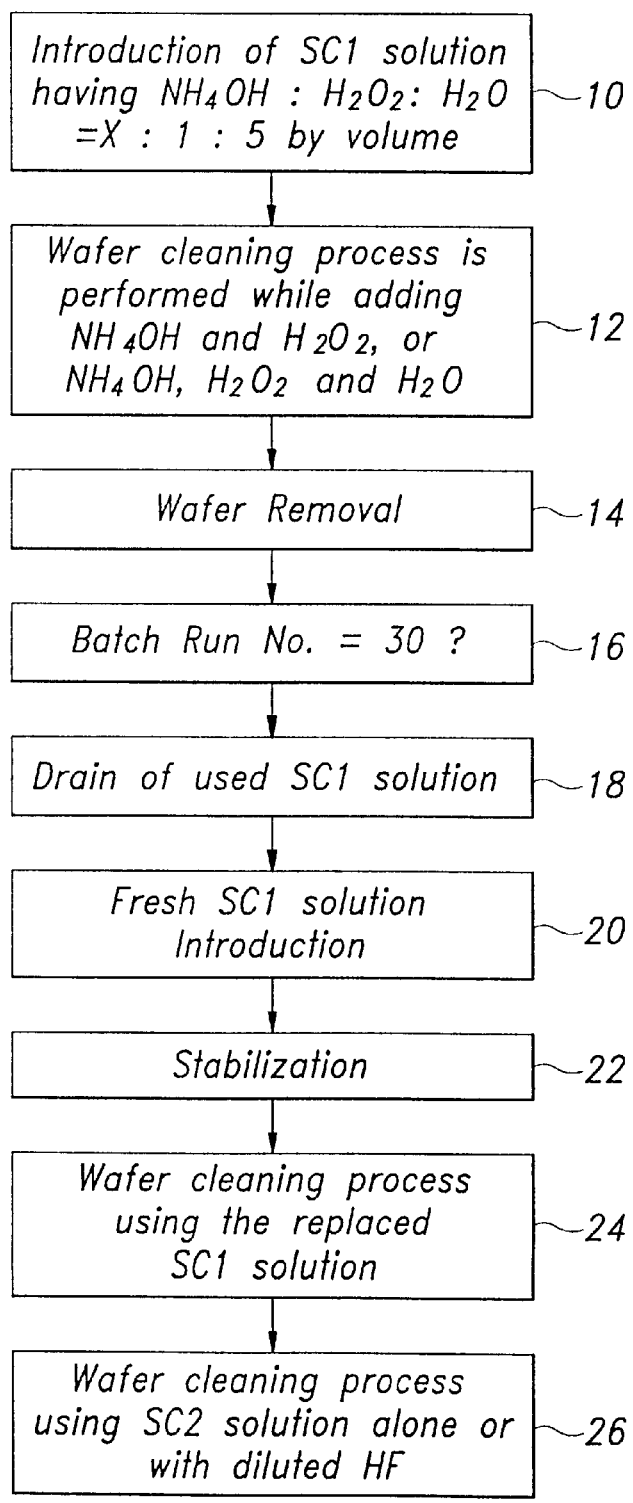
FIG. 3 is a flow chart of a semiconductor wafer cleaning process according to the present invention.

In the step 12 in FIG. 3, the amount of or rate at which NH$_4$OH and H$_2$O$_2$, or NH$_4$OH, H$_2$O$_2$ and H$_2$O is added to the bath is determined based on the spontaneous evaporation of NH$_3$ from the SC1 solution and the variation of NH$_4$OH concentration in the SC1 solution with the lapse of time during the cleaning process. In order to determine the amount or rate for maintaining the constant composition condition, experiments using SC1 solution having an initial composition of NH$_4$OH:H$_2$O$_2$:H$_2$O=1:4:20 were carried out under three conditions indicated in Table 1. Monitoring the experiments under these conditions made it possible to determine the rate at which the concentration of NH$_3$ in the SC1 solution decreased. Under condition 1, the SC1 solution was kept at 70° C. and was not being used in the cleaning process. For condition 2, the procedure was the same as that of condition 1 except that H$_2$O$_2$ was supplied at a rate of 40 ml/10 min. And for condition 3, the wafer cleaning process was performed using the SC1 solution of condition 1. The results are also summarized in Table 1.

TABLE 1

Rate at Which the Concentration of NH$_3$ in the SC1 Solution Decreased

| | Temp. | Addition | Cleaning | NH$_3$ decrease rate (wt %/min) | Relationship |
|---|---|---|---|---|---|
| Condition 1 | 70° C. | None | No | 0.0070 | −0.0070x + 0.95 |
| Condition 2 | 70° C. | H$_2$O$_2$ (40 ml/10 min) | No | 0.0067 | −0.0067x + 0.88 |
| Condition 3 | 70° C. | None | Yes | 0.0066 | −0.0066x + 0.85 |

The rate f(t) at which the concentration of NH$_3$ changes can be expressed as follows:

$$f(t) = -at + b$$

wherein a is an evaporation rate (wt %/min) of NH$_3$, and b is an initial concentration (wt %) of NH$_3$.

It can be seen from Table 1 that the function f(t) is not significantly affected by the addition of H$_2$O$_2$ or by whether the cleaning process is carried out, since the experimental error is +/−0.05% by weight.

In the meantime, in order to determine the variation of the concentration of H$_2$O$_2$ in the SC1 solution, experiments using SC1 solution having an initial composition of NH$_4$OH:H$_2$O$_2$:H$_2$O=1:4:20 were carried out under three conditions indicated in Table 2. These experiments were monitored to determine the rate at which the concentration of H$_2$O$_2$ in the SC1 solution increased. Under condition 4, the SC1 solution was kept at 70° C. without being used to carry out the cleaning process. For condition 5, the procedure was the same as that of condition 1 except that $NH_4OH$ was supplied at a rate of 74 ml/10 min. And for condition 6, the wafer cleaning process was performed using the SC1 solution of condition 4. The results are also summarized in Table 2.

electrical characteristics of the silicon wafers. The results of these experiments are used to establish the time a fresh solution must be left to stabilize after replacing a previous volume of solution (22 in FIG. 3).

In these experiments, a total of thirty (30) monolithic silicon bare wafers were cleaned continuously with a SC1 at 70° C. for 10 minutes, and an oxide ($SiO_2$) film was grown

TABLE 2

Rate at Which the Concentration of $H_2O_2$ in the SC1 Solution Increased

| | Temp. | Addition | Cleaning | $H_2O_2$ increase rate (wt %/min) | Relationship |
|---|---|---|---|---|---|
| Condition 4 | 70° C. | None | No | 0.0037 | 0.0037x + 6.60 |
| Condition 5 | 70° C. | $NH_4OH$ (74 ml/10 min) | No | 0.0038 | 0.0038x + 6.63 |
| Condition 6 | 70° C. | None | Yes | 0.0040 | 0.0040x + 6.87 |

The rate f(t) at which the concentration of $H_2O_2$ increases can be expressed as follows:

$$f(t)=a't+b'$$

wherein a' is a rate of increase (wt %/min) in the amount of the $H_2O_2$, and b' is an initial concentration (wt %) of the $H_2O_2$.

It can be seen from Table 2 that the function f'(t) is not significantly affected by the addition of $NH_4OH$ or by whether the cleaning process is carried out.

From the results in Table 1 and Table 2, it can be seen that the $NH_4OH$ ($NH_3$) concentration in the SC1 solution decreases over time, while the $H_2O_2$ concentration increases over time. The total volumes of $NH_4OH$ and $H_2O_2$ decrease over time, and the concentration of $H_2O_2$ increases because of the decrease in the $NH_3$ concentration.

Constant composition conditions were established based on the above-described experiments. Under either of these conditions, the standard solution has a useful life of up to thirty (30) runs. To establish constant composition condition 1, $NH_4OH$ is added at a rate of 10–20% of its initial weight per 10 minutes, and $H_2O_2$ is added at a rate of 0.5–2% of its initial weight per 10 minutes. To establish constant composition condition 2, $NH_4OH$ is added at a rate of 10–20% of its initial weight every 10 minutes, $H_2O_2$ is added at a rate of 0.5–2% of its initial weight per 10 minutes, and $H_2O$ is added at a rate of 1% or less of its initial weight per 10 minutes.

Figure 4:
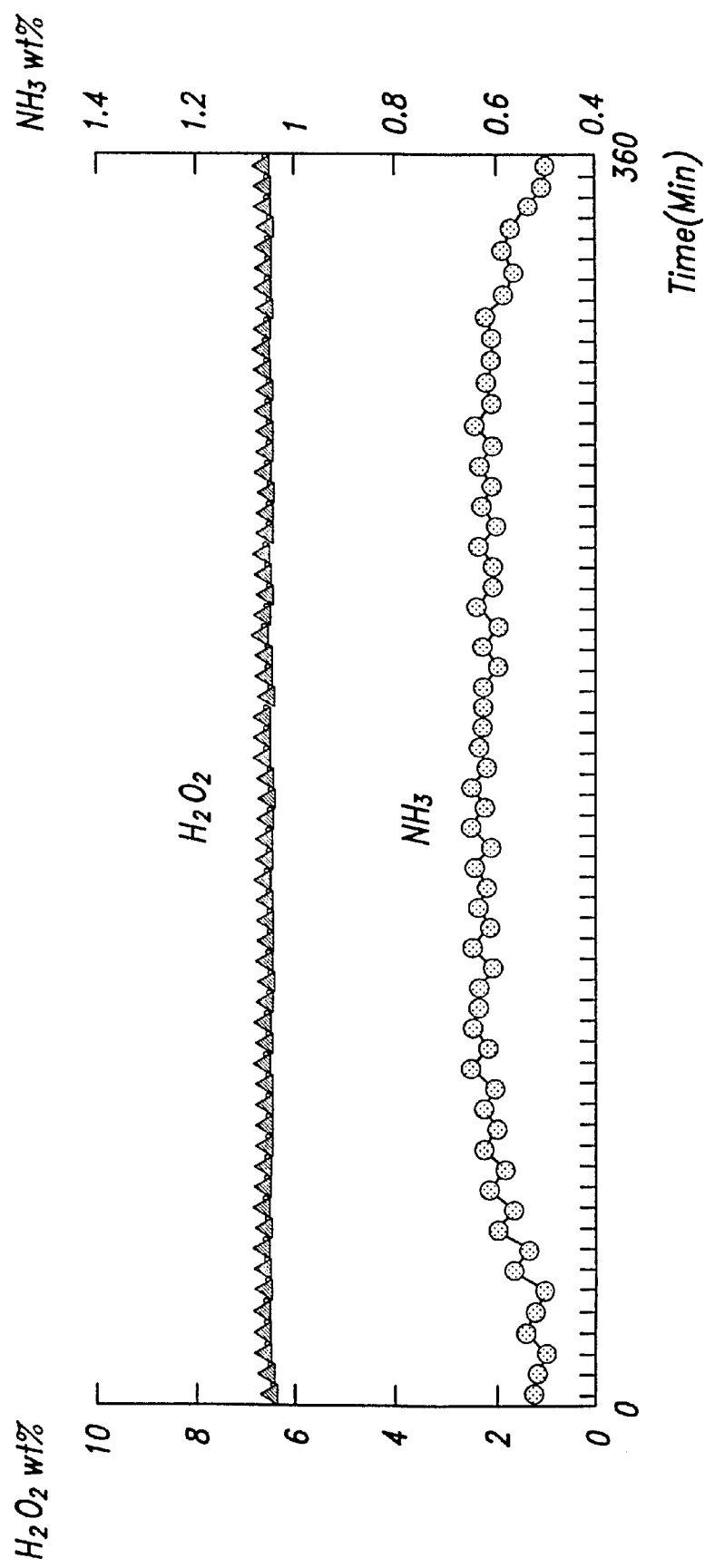
FIG. 4 is a graph showing the change in the concentrations of NH$_3$ and H$_2$O$_2$ in a standard cleaning 1 solution having an initial composition of NH$_4$OH:H$_2$O$_2$:H$_2$O=1:4:20 by volume, when the fixed quantity supply condition according to the present invention is established.

FIG. 4 shows the variations of the $NH_3$ and $H_2O_2$, when 30 runs of the batch wafer cleaning process are carried out at 70° C. while 14% by weight of $NH_4OH$ and 0.5% by weight of $H_2O_2$ are added to the cleaning system. In FIG. 4, the abscissa indicates time in minutes, and 30 runs of the batch process takes about 360 minutes. Since, as shown in FIG. 4, there is very little variation in the $NH_3$ concentration during the 30 runs of the batch cleaning process (for about 360 minutes), the SC1 can be used for 30 runs without being replaced.

The wafer cleaning process was evaluated for its cleaning efficacy by, for example, examining the etching rate which could be achieved on a wafer cleaned according to the present invention, and by determining the rate at which particulate impurities are removed from the wafer surface while a constant composition condition was established. Moreover, the strength of the dielectric breakdown electric field and the dielectric breakdown time were measured for each run of the batch process in order to evaluate the at 820° C. to a thickness of 100 Å on one surface of each of the wafers. A paleolithic silicon film was deposited thereon to a thickness of 2500 Å and doped with $POCl_3$ at 12 $\Omega/cm^2$. A deglazing process was performed to remove $SiO_2$ and $P_2O_5$ formed during the doping of $POCl_3$, by using a 33:1 HF solution for 3 minutes and then the SC1 solution for 10 minutes. Then, patterns which allowed the dielectric breakdown voltage to be measured were formed, the paleolithic silicon was dry-etched, the back of the final wafer product was ground, and the dielectric breakdown electric field and dielectric breakdown time were measured. The $SiO_2$ and $P_2O_5$ was completely removed by the HF solution during the deglazing process and the SC1 solution was used to prevent the formation of water marks on the wafer surface by changing the surface from hydrophobic to hydrophilic.

Figure 5:
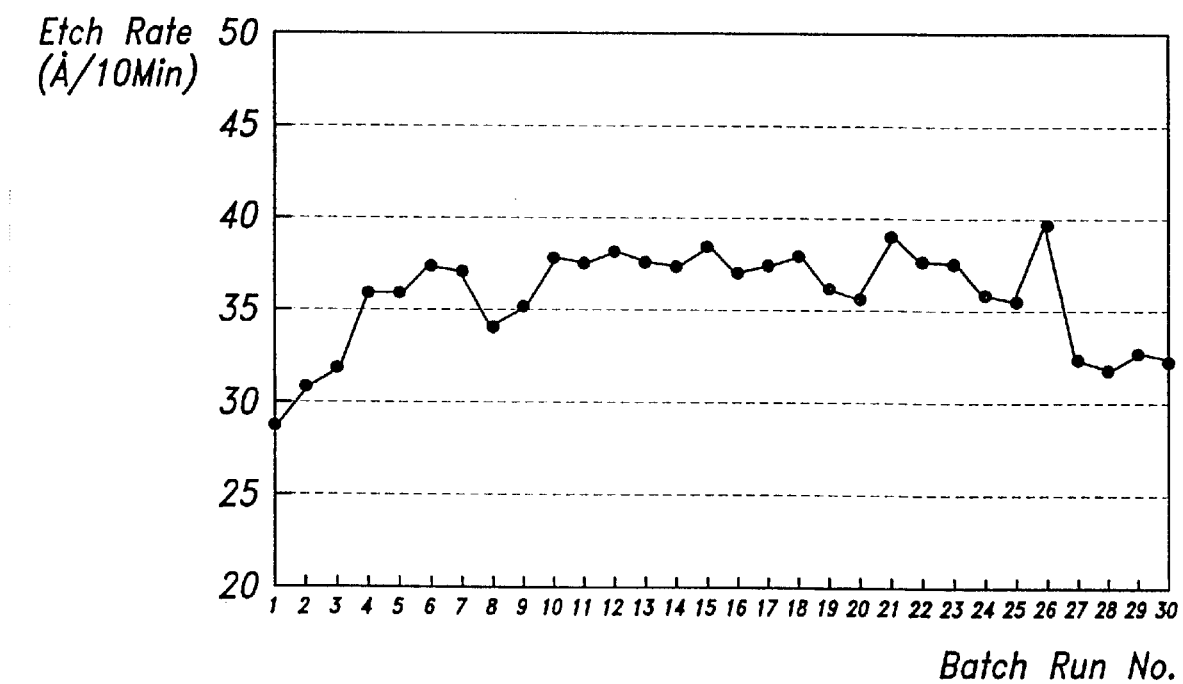
FIG. 5 is a graph showing results of the etching of the paleolithic silicon for each batch run when the fixed quantity supply condition according to the present invention is established.

FIG. 5 shows the rate at which paleolithic silicon is etched away by the SC1 solution with regard to the runs of the batch process. In FIG. 5, the abscissa indicates the run number of the batch process, and the ordinate indicates the etching rate in terms of Å per 10 minutes. With reference to FIG. 5, the etching rate varies over a range of only 35–40 Å/10 min. For the first 1–3 batch runs, the etching rate is relatively low, which is closely related to the fact that the $NH_3$ concentration is lower than the $H_2O_2$ concentration during these early batch runs.

Figure 6:
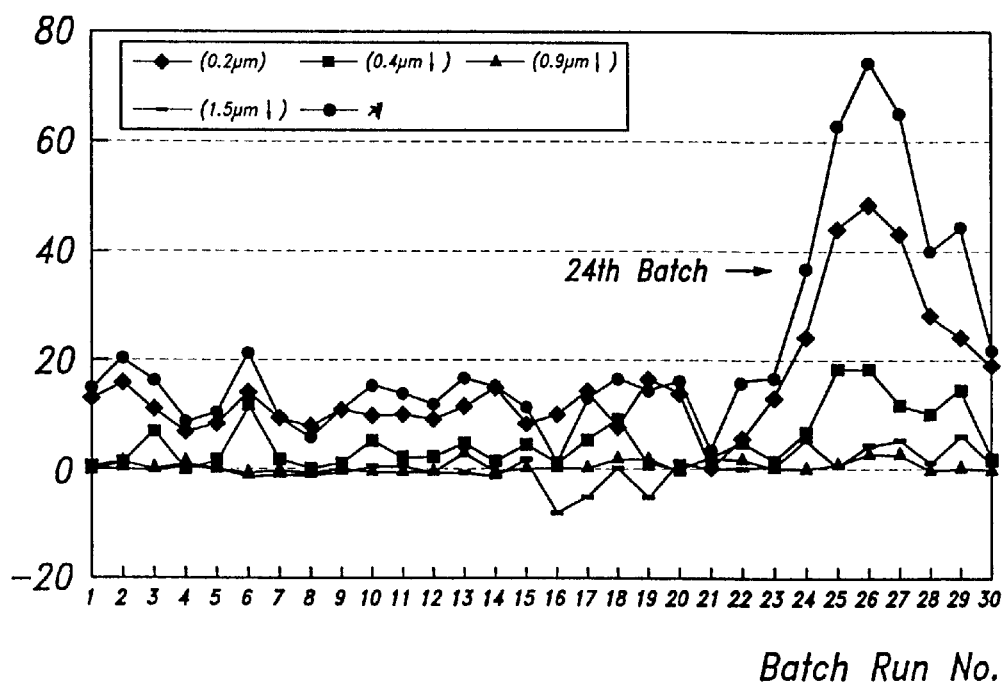
FIG. 6 is a graph showing the variation of the impure particles for each batch run when the fixed quantity supply condition according to the present invention is established.

FIG. 6 shows the variation of the number of particles of an impurity on the wafer surface before and after the cleaning process using the SC1 solution. In FIG. 6, the line—♦—indicates the number of particles having a diameter of 0.2 micrometers or less, the line—■—indicates those having a diameter of 0.4 micrometers or less, the line—▲—indicates those having a diameter of 0.9 micrometers or less, the line—▄—indicates those having a diameter of 1.5 micrometers or less, and the line—●—indicates the total number of particles. The number of particles are expressed as a relative value considering the initial number of particles as zero (0). Here, the initial number refers to the number of particles on the wafer surface just after the package of the wafer supplied by the manufacturer is opened. The profile of the change in the number of particles of 0.2 micrometers or less is very similar to that of the total number of particles. After 24 runs of the batch process, the number of particles increased abruptly because of the contamination of the wafer carrier and not because of the prolonged use of the SC1 solution.

Figure 7:
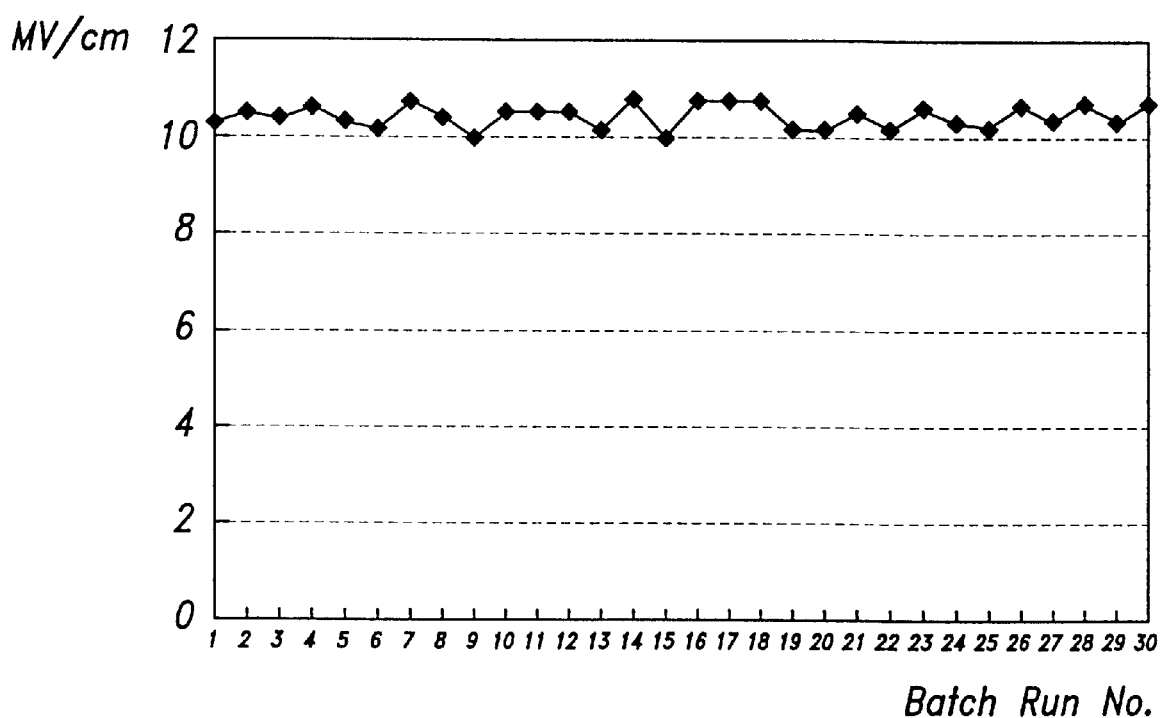
FIG. 7 is a graph showing the variation of the average dielectric breakdown field for each batch run when the fixed quantity supply condition according to the present invention is established.

FIG. 7 shows the average dielectric breakdown electric field of respective individual runs of the batch process with the prolonged use of the SC1 solution. The abscissa indicates the run number of the batch process and the ordinate indicates the strength of the electric field in MV/cm. The dielectric breakdown is measured using a pattern having a size of 0.4 cm$^2$ and a voltage of −20V applied to the gate. With reference to FIG. 7, the average dielectric breakdown field (MV/cm) is generally good with no significant variation between individual runs.

The average dielectric breakdown field is 10.40 MV/cm for the first 1–5 batches and 10.35 MV/cm for the remaining 6–30 batches, indicating that the uniformity of the oxide layer is not affected by the prolonged use of the SC1 solution.

Figure 8:
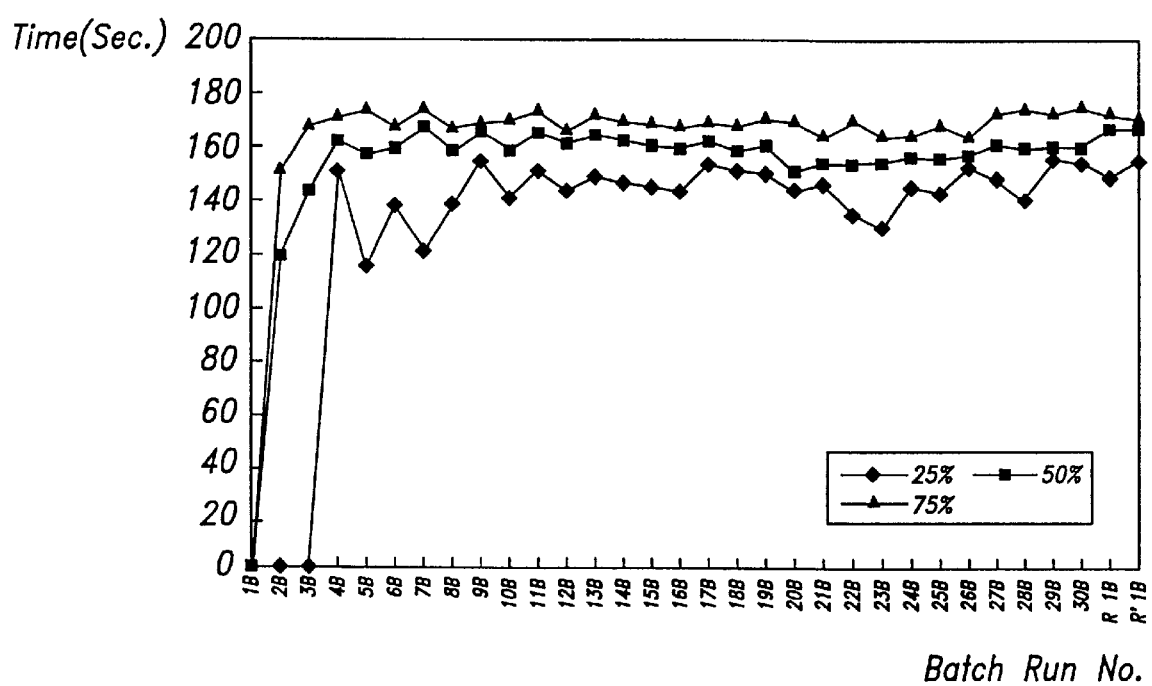
FIG. 8 is a graph showing the variation of the dielectric breakdown time for each batch run when the fixed quantity supply condition according to the present invention is established.

FIG. 8 shows the variation of the dielectric breakdown time depending on the run number of the batch process. In order to measure the dielectric breakdown time, an electric current of −100 microA is applied to a pattern of 0.001 cm$^2$ on a 100 Å oxide layer. Failures (25% or more) are observed within 0.5 seconds after the cleaning process is commenced for the first 1–3 runs of the batch processes. In particular, when the SC1 solution is replaced with a fresh one, the oxide layer breakdown failure, which is observed in the first run, occurs over both surfaces of the wafer. And, the failures observed in the second and third run of the batch process are localized on the upper surface of the wafer. Further, it was found that the breakdown failures under the cleaning condition described above occurred when the gate oxide has a thickness of 100 Å and the mixing of the SC1 solution is incomplete (e.g., the solution is not stirred or agitated).

The breakdown failures due to the incomplete mixing of the SC1 solution localized on the upper surface of the wafer. This may be interpreted to mean that the difference in the specific gravities of each component of the SC1 solution were the cause of local damage to the wafer surface. After 24 runs of the batch process, breakdown failures of 13.1% or less were observed, and the failures were distributed over the surfaces of the wafer.

As shown in FIG. 8, when the cleaning process is commenced just after the SC1 solution is replaced with a fresh one, the mixing of the components of the solution is incomplete, causing oxide layer breakdown failures of the silicon wafer, particularly in the early runs of the batch process. Accordingly, the fresh solution should be stabilized for a predetermined amount of time. For this purpose, a stabilization time of 10–30 minutes is preferable. Stabilizing the solution for a longer amount of time is not advantageous because such prolongs the overall time of the cleaning process and thus, decreases the efficiency of the cleaning process.

In FIG. 8, the abscissa indicates the run number of the batch process, 1B–30B designating the batch run numbers in which the same SC1 solution is used, and R1B and R'1B designating the batch run numbers in which a fresh SC1 solution is used.

According to the present invention as described hereinabove, the life of a standard cleaning solution can be increased by supplementing the solution with NH$_4$OH and H$_2$O$_2$, or NH$_4$OH, H$_2$O$_2$ and H$_2$O at a predetermined ratio, while the cleaning efficacy can be maintained by replacing the solution with a fresh one and allowing it to stabilize for a certain period of time before restarting the cleaning process.

Although preferred embodiments of the present invention have been described in detail hereinabove, many variations and/or modifications of the basic inventive concepts herein taught will appear to those skilled in the art. All such variations and/or modifications fall within the spirit and scope of the present invention as defined in the appended claims.

What is claimed is:

1. A method of cleaning a silicon wafer comprising:

(a) introducing a cleaning solution having an initial composition of NH$_4$OH:H$_2$O$_2$:H$_2$O=0.25:1:5 by volume into a cleaning bath;

(b) heating the cleaning solution to a predetermined temperature;

(c) cleaning the wafer using the solution in the bath while adding predetermined amounts of NH$_4$OH and H$_2$O$_2$ to the solution; and (d) removing the wafer from the bath, wherein the cleaning solution is stabilized for a certain period of time before cleaning the wafer.

2. A method of cleaning a silicon wafer according to claim 1, wherein said certain period of time is 10–30 minutes.

3. A method of cleaning a silicon wafer according to claim 1, wherein said predetermined temperature is about 70° C.

4. A method of cleaning a silicon wafer according to claim 1, wherein the NH$_4$OH is added at a rate of 10–20% of its initial weight in the solution per 10 minutes.

5. A method of cleaning a silicon wafer according to claim 4, wherein the H$_2$O$_2$ is added at a rate of 0.5–2% of its initial weight in the solution per 10 minutes.

6. A method of cleaning a silicon wafer according to claim 5, and further comprising adding H$_2$O at a rate of about 1% of its initial weight in the solution per 10 minutes, while the wafers are being cleaned.

7. A method of cleaning a silicon wafer according to claim 4, and further comprising adding H$_2$O at a rate of about 1% of its initial weight in the solution per 10 minutes, while the wafers are being cleaned.

8. A method of cleaning a silicon wafer according to claim 1, wherein the NH$_4$OH is added at a rate of about 14% of its initial weight in the solution per 10 minutes, and the H$_2$O$_2$ is added at a rate of about 0.52% of its initial weight in the solution per 10 minutes.

9. A method of cleaning a silicon wafer according to claim 1, and further comprising cleaning the wafer with a second cleaning solution having a composition of HCl:H$_2$O$_2$:H$_2$O= 1:1:6 to 1:2:8 by volume.

10. A method of cleaning a silicon wafer according to claim 9, wherein the second cleaning solution is in a mixture with a diluted HF solution.

11. A method of cleaning a silicon wafer according to claim 10, wherein the diluted HF solution has a concentration in a range of 1000:1 to 200:1.

* * * * *